United States Patent [19]
Kobatake

[11] Patent Number: 5,477,186
[45] Date of Patent: Dec. 19, 1995

[54] CHOPPER TYPE DIFFERENTIAL AMPLIFIER USING MOS GATE CAPACITORS

[75] Inventor: Hiroyuki Kobatake, Tokyo, Japan

[73] Assignee: NEC Corporation, Tokyo, Japan

[21] Appl. No.: 286,456

[22] Filed: Aug. 5, 1994

[30] Foreign Application Priority Data

Aug. 5, 1993 [JP] Japan ................................. 5-193786

[51] Int. Cl.⁶ ............................................. H03F 3/45
[52] U.S. Cl. ......................... 330/9; 330/51; 327/307; 327/563
[58] Field of Search ................... 330/9, 51; 327/307, 327/563

[56] References Cited

U.S. PATENT DOCUMENTS

| | | |
|---|---|---|
| 4,553,052 | 11/1985 | Takahashi . |
| 4,611,130 | 9/1986 | Swanson . |
| 4,883,987 | 11/1989 | Fattaruso . |
| 5,142,238 | 8/1992 | White ................................ 330/51 X |

FOREIGN PATENT DOCUMENTS 2258779  2/1993  United Kingdom .

*Primary Examiner*—James B. Mullins
*Attorney, Agent, or Firm*—Young & Thompson

[57] ABSTRACT

The chopper type differential amplifier according to this invention includes a differential amplifier having a first input end and a second input end, a first input terminal supplied with a first input signal, a second input terminal supplied with a second input signal, a first MOS gate capacitor having its gate electrode connected to the first input end of the differential amplifier and its lower electrode connected to the first input terminal, a second MOS gate capacitor having its gate electrode connected to the second input end of the differential amplifier and its lower electrode connected to the second input terminal, and a precharging circuit which supplies a precharging voltage to the gate electrode of the first MOS gate capacitor and the gate electrode of the second MOS gate capacitor during the precharging period, wherein the precharging voltage is a voltage which is all the time higher than the voltages of the first input signal and the second input signal.

8 Claims, 6 Drawing Sheets

CHOPPER TYPE DIFFERENTIAL AMPLIFIER USING MOS GATE CAPACITORS

BACKGROUND OF THE INVENTION

1. Field of the Invention

The present invention relates to a chopper type differential amplifier, and more particularly to a chopper type differential amplifier in which input signals are supplied via MOS gate capacitors precharged to specified potentials.

2. Description of the Prior Art

A differential amplifier to which input signals are supplied via capacitors precharged to predetermined potentials is generally called a chopper type differential amplifier. Since the amplitude of the input signals can be taken large in the chopper type differential amplifier, it is used widely in A/D converter or the like.

In order to simplify the manufacturing process, the so-called MOS gate capacitor in which the transistor structure is employed as a capacitor to receive the input signal, has been used in the past. This kind of chopper type differential amplifier will be described by making reference to FIG. 1. The lower electrode side of a MOS gate capacitor CG1 is supplied with an input signal VI(+), and the gate electrode side of CG1 is connected to one of the input ends (noninverting input side) 2 of a differential amplifier 1. Similarly, the lower electrode side of a MOS gate capacitor CG2 is supplied with an input signal VI(−), and the gate electrode side of CG2 is connected to the other input end (inverting input side) 3 of the differential amplifier 1. The input ends 2 and 3 of the differential amplifier 1 are connected to a precharging circuit 40 which precharges both input ends 2 and 3 to a potential of Vdd/2 during the precharging period.

The precharging circuit 40 comprises N-channel MOS-FETs QN31 and QN32 whose gate electrodes receive a sampling signal S31, drain electrodes are connected to a precharging voltage terminal 4 and source electrodes are connected to the input terminal 2 and the input terminal 3, respectively, of the differential amplifier 1, and P-channel MOS-FETs QP31 and QP32 whose gate electrodes receive a sampling signal S32, drain electrodes are connected to the precharging voltage terminal 4 and source electrodes are connected to the input end 2 and the input end 3, respectively, of the differential amplifier 1. The precharging voltage terminal 4 is provided with a voltage of Vdd/2 in contrast to the power supply voltage Vdd supplied to the differential amplifier 1 via a power supply voltage terminal 6.

The reason for using Vdd/2 as the precharging voltage is as described below. If the precharging voltage is chosen to be Vdd, then the voltage of the input end 2 or 3 of the differential amplifier 1 will be raised to beyond Vdd in response to the changes in the input signal. What will become of problem here is that the sources of the P-channel transistors QP31 and QP32 that constitute the precharging circuit 40 are connected to the input ends 2 and 3, respectively. In the P-channel transistor, P-type source and drain regions are formed on an N-type well region. Since the N-type well region is generally biased Vdd, there arises a problem that a forward bias condition of a P-N junction is generated in the P-type source regions to which the input ends 2 and 3 are connected, if the potentials of the regions become higher than Vdd.

Accordingly, if the maximum variations in the input signals are assumed to be ±Vdd/2, the precharging voltage must be set to be lower than Vdd/2 in order for the voltages of the input terminals 2 and 3 not to exceed Vdd.

An example of the MOS gate capacitors CG1 and CG2 shown in FIG. 1 is illustrated in FIG. 3. An N-type diffused layer 10 working as the lower electrode is formed in an N-type well 8 formed in a P-type silicon substrate 7, and a gate electrodes 11 is formed via an insulating film.

Next, referring to FIG. 2, operation of the chopper type differential amplifier shown in FIG. 1 will be described.

First, input signals VI(+) and VI(−) are applied to the lower electrodes of the MOS gate capacitors CG1 and CG2 respectively, and the sampling signal S31 goes to a high level. Consequently, the N-channel MOS-FETs QN31 and QN32 are turned on. At the same time, the sampling signal S32 goes to a low level, and the P-channel MOS-FETs QP31 and QP32 are also turned on. As a result, the input end 2 and the input end 3 (the gate electrodes of the MOS gate capacitors CG1 and CG2) of the differential amplifier 1 are precharged to the voltage of Vdd/2.

Subsequently, simultaneous with the shifting of the sampling signal S31 to the low level and the turning-off of the N-channel MOS-FETs QN31 and QN32, the sampling signal S32 goes to the high level and the P-channel MOS-FETs QP31 and QP32 are also turned off, and the charges stored in the MOS gate capacitors CG1 and CG2 are conserved. Then, the level of one of the input signals (it is VI(+) here) undergoes a change. For example, if the voltage of the input signal VI(+) is raised slightly as shown by the solid line in FIG. 2, the potential V(+) of the input end 2 of the differential amplifier 1 goes also to a potential which is slightly higher than Vdd/2 as shown by the solid line in the figure. Accordingly, the output signal VO from the output terminal of the differential amplifier 1 goes to a high level as shown by the solid line in the figure.

On the other hand, when the input signal VI(+) drops slightly as indicated by the broken line in the figure, the potential V(+) of the input end 2 of the differential amplifier 1 goes to a potential slightly lower than Vdd/2 as shown by the broken line, so that a low level output signal VO is output from the output terminal of the differential amplifier 1.

The conventional chopper type differential amplifier can detect a slight difference in the input signal as described in the above.

The conventional chopper type differential amplifier 10 has a problem in that the MOS gate capacitor has a dependence on the bias so that the device tends to undergo malfunction by generating an unbalance in the input impedance depending upon the potential of the input signal, and being affected by the noise. The reason for this will be described in the following.

In general, the capacitance CG of the MOS gate capacitor can be represented by either of the following two expressions depending upon the bias voltage applied (in the following discussion, the case of a MOS gate capacitor with a structure as shown in FIG. 3 will be adopted for the reason of simplicity).

1. Case of VGS>0 V $$C_G = COX. \quad (1)$$

2. Case of VGS<0 V $$C_G = \frac{C_{OX}}{\sqrt{1 + 2X^2_{SiO_2} \times \epsilon_0 |V_{GS}|/X_{Si} \times q \times N_D \times t_{OX}^2}} \quad (2)$$

In Eq. (2), $X_{SiO_2}$ is the relative permittivity of the gate insulating film, $X_{Si}$ is the relative permittivity of silicon, $\epsilon_0$ is the permittivity of vacuum, q is the charge on the electron, $N_D$ is the impurity concentration of silicon crystal, $t_{OX}$ is the thickness of the gate insulating film, $C_{OX}$ is the capacitance of the gate insulating film, and $V_{GS}$ is the voltage difference between the gate electrode and the lower electrode.

Thus, it is assumed, for example, that the impurity concentration of the N well is $N_D=5\times10^{18}$ cm$^{-3}$ and $t_{OX}=15$ nm in the MOS gate capacitor shown in FIG. 3, the MOS gate capacitance CG shows a bias dependence as shown by the solid line in FIG. 4. Here, if the potentials of the input signals are in an unbalanced relation in which, for example, VI(+)>Vdd/2 and VI(-)<Vdd/2, the MOS gate capacitance CG1 is biased negatively (VGS<0 V) while the MOS gate capacitance CG2 is biased positively ($V_{GS}>0$ V). From this result, as is clear from the bias dependence shown by the solid line in FIG. 4, the capacitances of the two MOS gate capacitors CG1 and CG2 show an unbalance CG1<CG2.

If an in-phase noise creeps into the two input ends 2 and 3 of the differential amplifier 1 in this state by, for example, the injection of the same electric charges, the input potentials to the input ends 2 and 3 of the differential amplifier 1 become potentials with different amplitude as shown by VV(+) and VV(-) in FIG. 2. Accordingly, an erroneous output signal as shown by WO is output from the output terminal of the differential amplifier 1.

SUMMARY AND OBJECTS

It is therefore the object of this invention to provide a chopper type differential amplifier which is free from generating an unbalance in the input impedance due to potential changes in the input signals.

The chopper type differential amplifier according to this invention comprises a differential amplifier circuit having a first input end and a second input end, a first input terminal which receives a first input signal, a second input terminal which receives a second input signal, a first MOS gate capacitor with its gate electrode connected to the first input end of the differential amplifier and its lower electrode connected to the first input terminal, a second MOS gate capacitor with its gate electrode connected to the second input end of the differential amplifier and its lower electrode connected to the second input terminal, and a precharging circuit which supplies during the precharging period a precharging voltage to the gate electrode of the first MOS gate capacitor and the gate electrode of the second MOS gate capacitor, where the precharging voltage is a voltage which is always higher than the voltage of the first input signal and the second input signal.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE INVENTION

Figure 1:
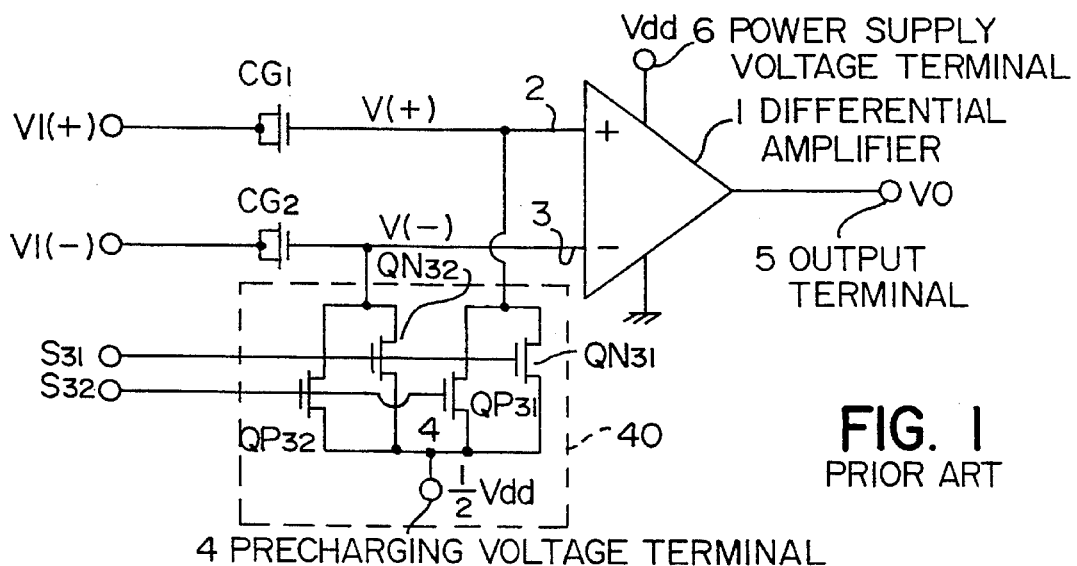
FIG. 1 is a circuit diagram for a conventional chopper type differential amplifier.
Figure 2:
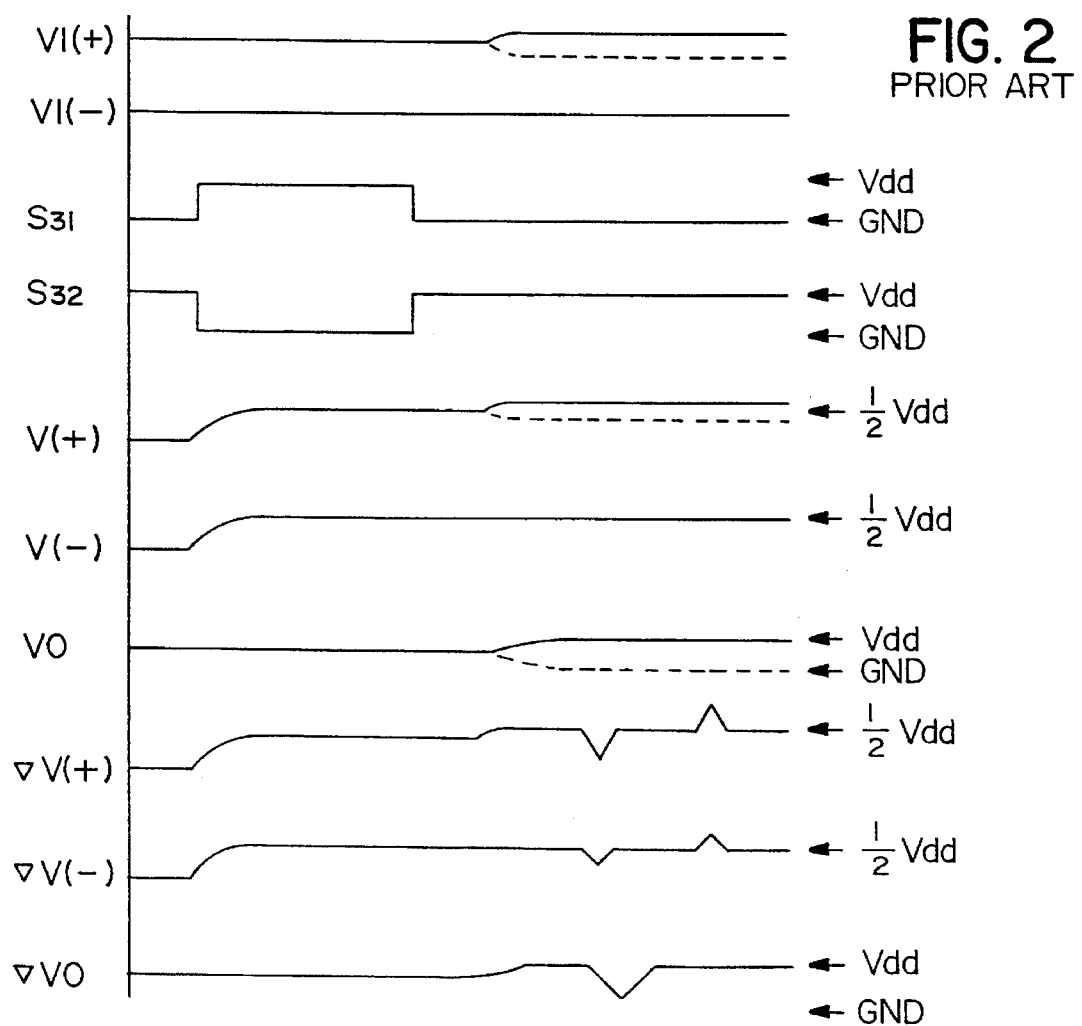
FIG. 2 is an operating waveform diagram of the differential amplifier shown in FIG. 1.
Figure 3:
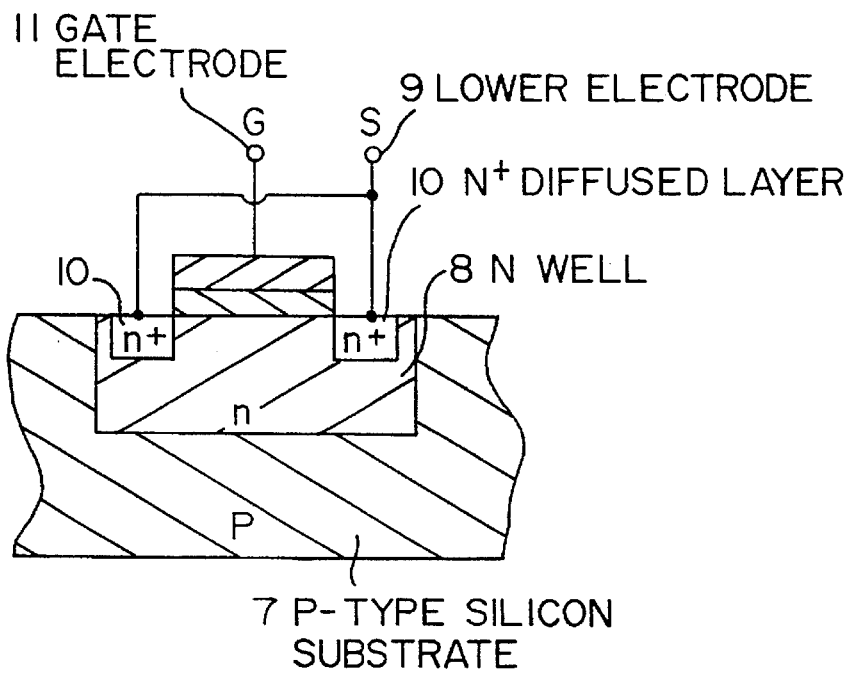
FIG. 3 is a sectional view showing the structure of a MOS gate capacitor.

The first embodiment of this invention will be described by reference to FIG. 5. The components identical to those of the chopper type differential amplifier shown in FIG. 1 are assigned identical reference numerals to omit a further description. This embodiment has a feature in a precharging circuit 41. The precharging circuit 41 comprises a precharging voltage terminal 4 which is supplied with a voltage Vp higher than the power supply voltage Vdd, an N-channel MOS-FET QN11 having a gate electrode supplied with a sampling signal S11 and the source-drain path connected between the input end 2 of the differential amplifier 1 and the precharging voltage terminal 4, and an N-channel MOS-FET QN12 having a gate electrode supplied with the sampling signal S11 and the source-drain path connected between the input end 3 of the differential amplifier 1 and the precharging voltage terminal 4. The precharging voltage Vp is an externally supplied boost-up voltage or a boost-up voltage generated by an internal boost-up circuit.

Figure 7:
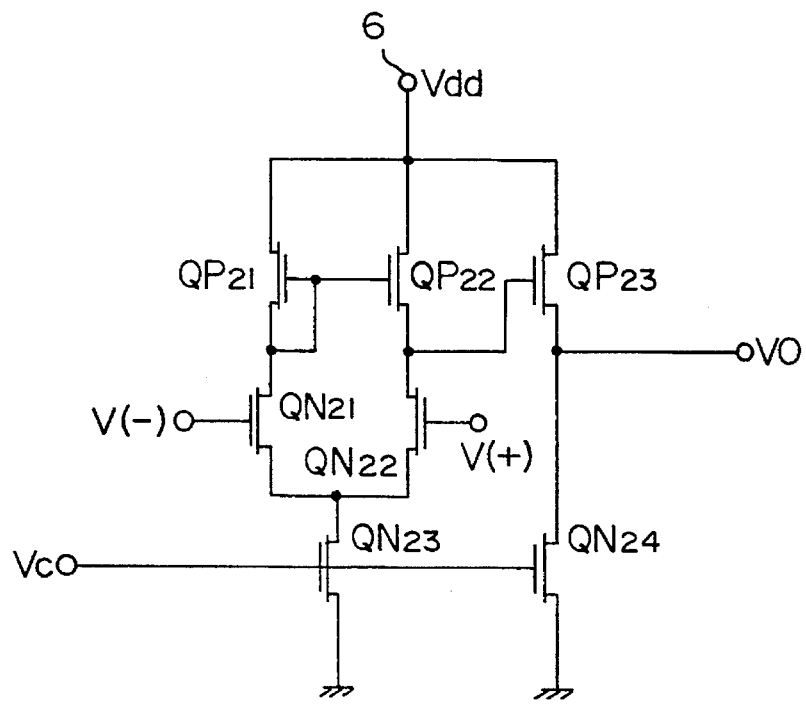
FIG. 7 is a circuit diagram for the differential amplifier shown in FIG. 5.
Figure 8:
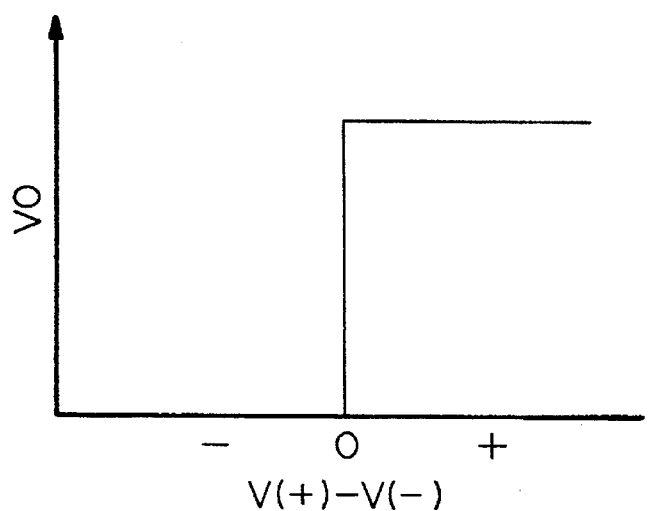
FIG. 8 is a chart showing the input and output characteristics of the circuit shown in FIG. 7.

A specific circuit configuration of the differential amplifier 1 is shown in FIG. 7. Input signals V(+) and V(-) are supplied to N-channel MOS-FETs QN22 and QN21, respectively, and a constant voltage Vc is supplied to the gate electrodes of N-channel MOS-FETs QN23 and QN24. The output signal VO is taken out from the junction of a P-channel MOS-FET QP23 and the N-channel MOS-FET QN24. As shown in FIG. 8, the output signal VO is at a low level when the difference of the two input signals (V(+)- V(-)) is negative, and at a high level when it is positive.

Next, referring to FIG. 6, the operation of the chopper type differential amplifier shown in FIG. 5 will be described. The embodiment will be described for the case where the input signal V(+) is a signal whose potential varies in the range from 0 V to Vdd, while the input signal V(−) has a constant value. First, the input signals VI(+) and VI(−) are applied to the lower electrodes of the MOS gate capacitors CG1 and CG2 and the sampling signal S11 goes to the high level, therefore the N-channel MOS-FETs QN11 and QN12 are turned on. As a result, the input ends and 3 (the gate electrodes of the MOS gate capacitors CG1 and CG2) of the differential amplifier 1 are precharged to the voltage Vp (Vp≧Vdd) of the precharging voltage terminal 4. Here, the high level VH1 of the sampling signal S11 is set to satisfy the relation VH1≧Vp+$V_{TN}$, where $V_{TN}$ is the threshold voltage of the N-channel MOS-FETs QN11 and QN12.

Then, the sampling signal S11 goes to the low level and the N-channel MOS-FETs QN11 and QN12 are turned off. Charge which stored in the MOS gate capacitors CG1 and CG2 are conserved, and an input signal (VI(+) in this embodiment) undergoes a change. In this case, if the input signal VI(+) is raised slightly as shown by the solid line in FIG. 6, the potential of the input end 2 of the differential amplifier 1 also goes to a potential slightly higher than that of the precharging signal Vp, and a high level output signal VO shown by the solid line is output from the output terminal of the differential amplifier 1. On the other hand, when the input signal VI(+) drops slightly (as shown by the broken line), the input end 2 of the differential amplifier 1 becomes to have a potential (V+) slightly lower than the precharging voltage Vp and a low level output signal VO is output from the output terminal of the differential amplifier 1, in a manner analogous to the above.

Figure 4:
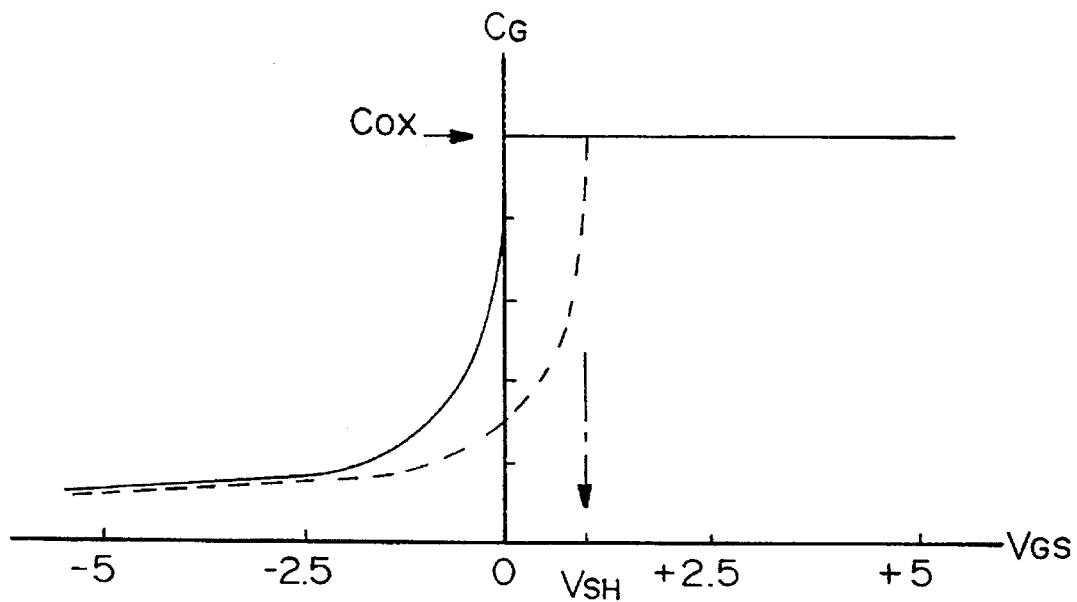
FIG. 4 is a chart showing the bias voltage dependence of the MOS gate capacitor shown in FIG. 3.

Since one has 0≦VI(+)≦Vdd and 0≦VI(−)≦Vdd when the precharging voltage Vp is set to satisfy Vp≧Vdd in this embodiment, the MOS gate capacitors CG1 and CG2 always hold the relation VGS≧0 V for the voltage $V_{GS}$ between the gate electrode and the lower electrode. As a result, even when the MOS gate capacitors CG1 and CG2 have the bias dependence as shown by the solid line in FIG. 4, the capacitances of the MOS gate capacitors CG1 and CG2 are constant ($C_{OX}$) independent of the potentials of the input signals and will not show an unbalance. Accordingly, even if an in-phase noise, for example, is applied to the input ends 2 and 3 of the differential amplifier 1, the potentials of the two input ends of the differential amplifier 1 appear as potential changes with identical amplitudes, as shown in VV(+) and VV(−) in FIG. 6. Therefore, a high level output signal of the correct output level is always output from the output terminal 5.

That the bias dependence of the MOS gate capacitor is shifted due to the capture of electric charges by the interface between the gate insulating film and the silicon crystal or to the difference in the work functions of the gate electrode and the silicon crystal is a well-known fact. Assume, for example, that the bias dependence of the capacitance is shifted in the positive direction by the amount corresponding to the voltage $V_{SH}$ as shown by the broken line in FIG. 4. In this case, the precharging voltage Vp is set to a value higher than the power supply voltage Vdd of the differential amplifier 1 by more than the amount corresponding to $V_{SH}$, namely, to Vp≧Vdd+$V_{SH}$. Since the MOS gate capacitors CG1 and CG2 are always biased so as to satisfy $V_{GS}$≧$V_{SH}$, the capacitances of the MOS gate capacitors CG1 and CG2 become constant independent of the potentials of the input signals.

Figure 9:
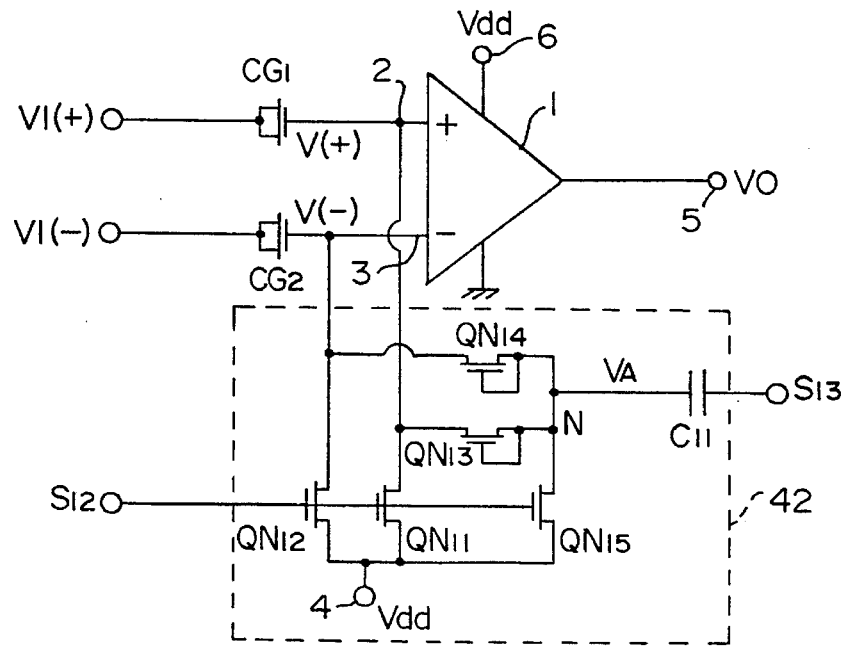
FIG. 9 is a circuit diagram for the chopper type differential amplifier showing a second embodiment of this invention.

Next, referring to FIG. 9, the second embodiment of this invention will be described. This embodiment differs from the first embodiment shown in FIG. 5 in the configuration of the precharging circuit 42. The precharging circuit 42 includes a diode-connected N-channel MOS-FET QN13 having its gate electrode and the drain electrode connected to a junction node N and its source electrode connected to the input end 2 of the differential amplifier 1, a diode-connected N-channel MOS-FET QN14 having its gate electrode and the drain electrode connected to the junction node N and its source electrode connected to the input end 3 of the differential amplifier 1, an N-channel MOS-FET QN15 having a gate electrode supplied with a sampling signal S12 and its drain electrode and source electrode connected to the precharging voltage terminal 4 (with voltage Vdd) and the junction node N, respectively, and a capacitance element C11 whose one end is connected to the junction node N and the other end connected to a sampling signal S13.

The sampling signal S12 is applied to the gates of the N-channel MOS-FETs QN11, QN12 and QN15.

In this embodiment, a voltage equal to the power supply voltage Vdd of the differential amplifier 1 is applied to the precharging voltage terminal 4. In other words, Vp =Vdd in this embodiment, in contrast to Vp≧Vdd in the first embodiment. In addition, the high level VH of the sampling signals S12 and S13 satisfies the relation VH=Vdd.

Figure 10:
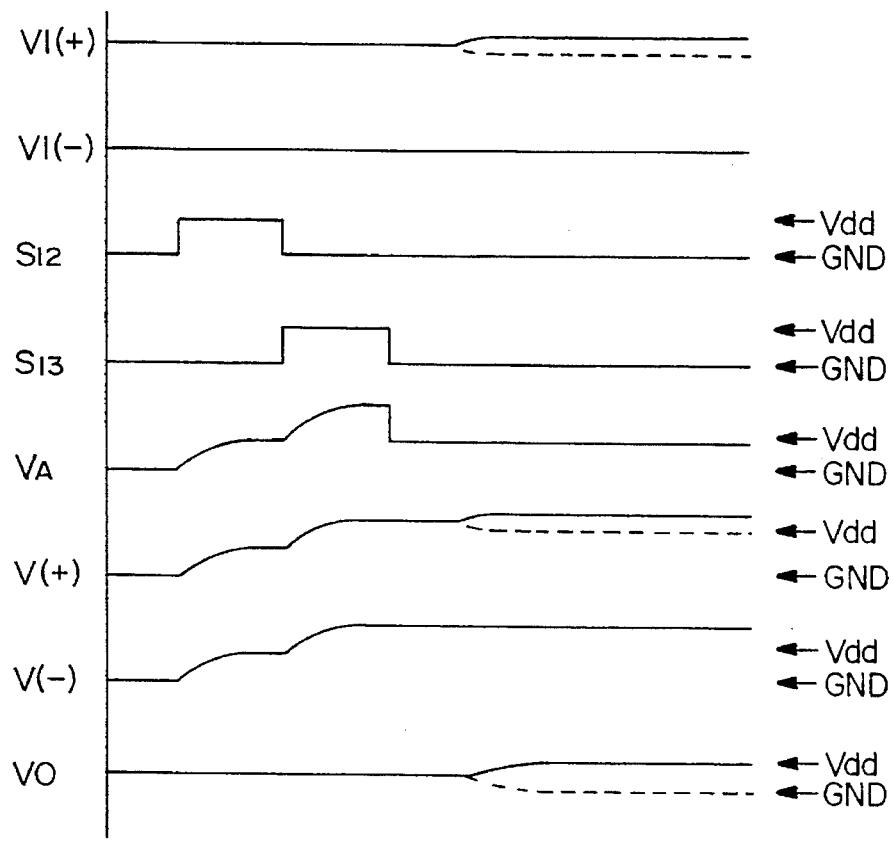
FIG. 10 is an operating waveform diagram of the 10 chopper type differential amplifier shown in FIG. 9

Next, referring to FIG. 10, the operation of this embodiment will be described. First, the input signals VI(+) and VI(−) are applied to the lower electrodes of the MOS gate capacitors CG1 and CG2, and the sampling signal S12 goes to the high level (=Vdd), which turns on the N-channel MOS-FETs QN11, QN12 and QN15. As a result, the potential VA of the two input ends 2 and 3 (the gate electrodes of the MOS gate capacitors CG1 and CG2) and the junction node N are charged up to VA=Vdd−$V_{TN}$, where VTN is the threshold voltage of the N-channel MOS-FETs QN11, QN12 and QN15.

Subsequently, simultaneous with the going of the sampling signal S12 to the low level and the turning-off of the N-channel MOS-FETs QN11, QN12 and QN15, the sampling signal S13 goes to the high level (=Vdd) and the potential VA of the junction node N is boosted up to VA=2 Vdd−VTN due to a capacitance element C11. As a result, N-channel MOS-FETs QN13 and QN14 are turned on and charges are shifted so that the potentials V(+) and V(−) of the two input ends 2 and 3 of the differential amplifier 1 are raised to the potential given by Eq. (3) that follows:

$$V_{(+)} = V_{(-)} = \frac{(Vdd - V_{TN})(2C_{11} + CG1 + CG2)}{C_{11} + CG_1 + CG_2}, \quad (3)$$

where VTN is the threshold voltage of the N-channel MOS-FETs QN13 and QN14. Consequently, the N-channel MOS-FETs QN13 and QN14 are turned off again.

From Eq. (3) it can be seen that it is possible to set the gate electrode potentials V(+) and V(−) of the MOS gate capacitors CG1 and CG2 to an arbitrary potential which satisfies the conditions V(+)=V(−)≧Vdd by appropriately setting the value of the capacitor C11.

Then, after the sampling signal S13 is sent to the low level and the charges stored in the MOS gate capacitors CG1 and CG2 are conserved, the input signal VI(+) undergoes a change to output an output signal.

In this embodiment, it is possible to set the potentials of the two input ends 2 and 3 of the differential amplifier 1, that is, the gate electrode potentials of the MOS gate capacitors CG1 and CG2, to be equal to or higher than the power supply voltage Vdd of the differential amplifier 1. Accordingly, the capacitances of the MOS gate capacitors CG1 and CG2 are constant regardless of the potentials of the input signals, and hence an output signal of the correct level can be output even if an in-phase noise is applied to the two input ends 2 and 3 of the differential amplifier 1.

Moreover, in the first embodiment there is required a boost-up means such as a charge pump due to the fact that Vp and the high level of the sampling signal S11 have voltage values higher than the power supply voltage Vdd. In this embodiment, however, there is no need for a high voltage terminal or a sampling signal with a voltage higher than the power supply voltage Vdd, so that an additional voltage boost-up means such as a charge pump is not called for.

Figure 11:
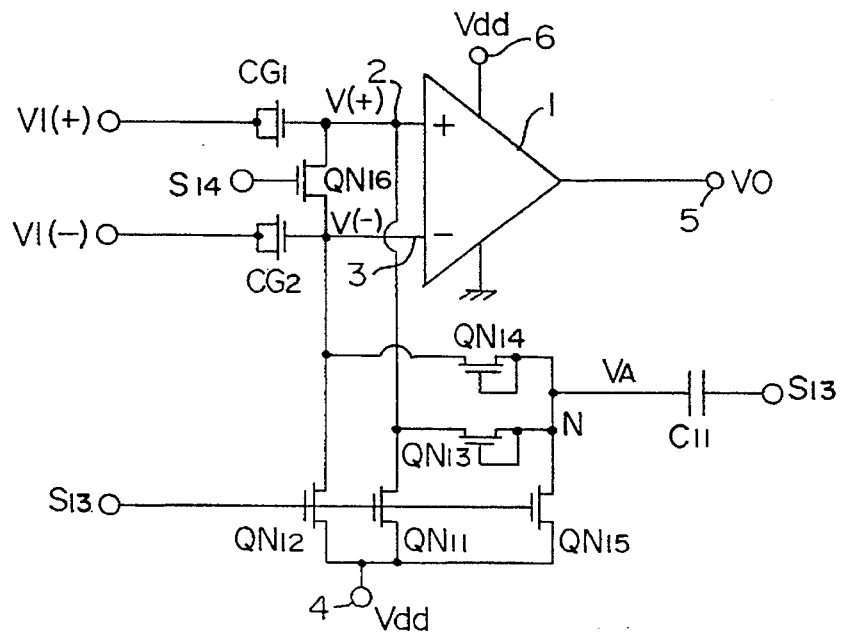
FIG. 11 is a circuit diagram for the chopper type differential amplifier showing a third embodiment of this invention.
Figure 12:
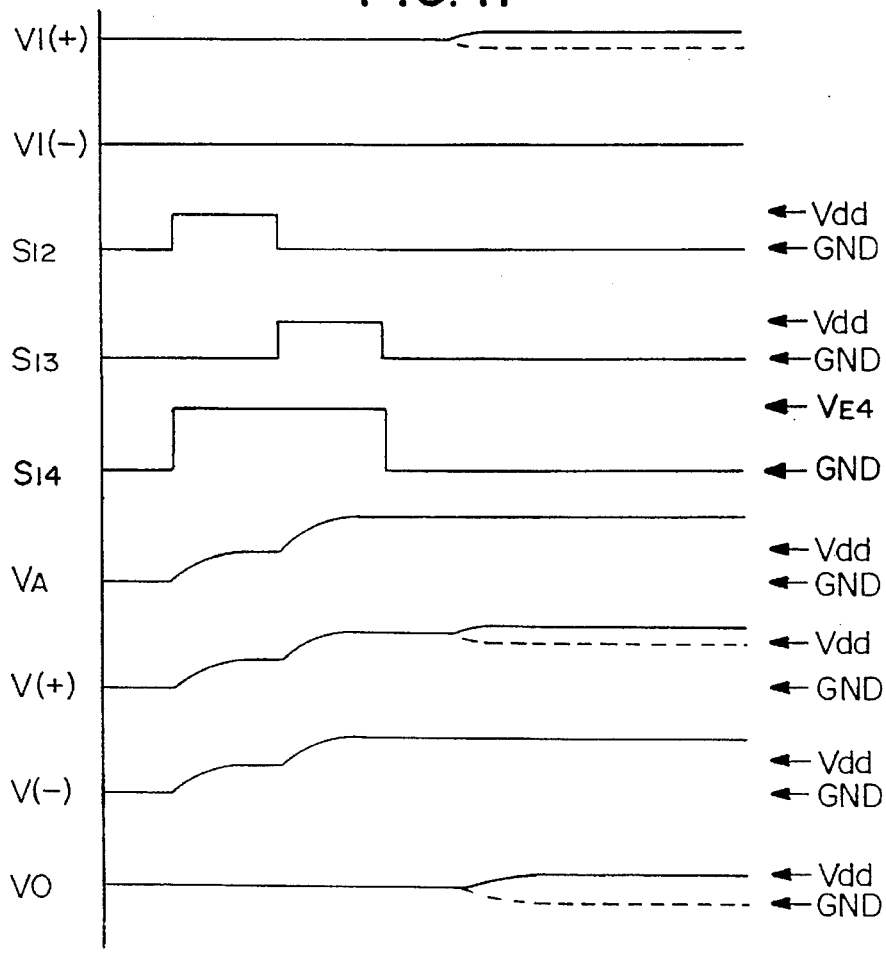
FIG. 12 is an operating waveform diagram of the chopper type differential amplifier shown in FIG. 11.

Next, referring to FIG. 11, the third embodiment of this invention will be described. In this embodiment, a sampling signal S14 is applied to the gate electrodes, and an equalizing N-channel MOS-FET QN16 with its drain electrode and source electrode connected to the input ends 2 and 3, respectively, of the differential amplifier 1 are provided in addition to the second embodiment shown in FIG. 9.

Next, referring to FIG. 10, the operation of the equalizing N-channel MOS-FET QN16 will be described. During the sampling period (the period in which the sampling signal S13 is at the high level following the sampling signal S12), the sampling signal S14 is at the high level and the equalizing N-channel MOS-FET QN16 is kept turned on. Accordingly, the two input ends 2 and 3 of the differential amplifier 1 are short-circuited, and an offset voltage generated during the sampling period is canceled. Here, the high level voltage VH4 of the sampling signal S14 is set to satisfy $VH4 \geq V(+)+V_{TN}$, where $V_{TN}$ is the threshold voltage of the equalizing N-channel MOS-FET QN16. In this embodiment, malfunctions will not be generated either since the correct output signal is output all the time regardless of an in-phase noise applied to the two input ends of the differential amplifier 1.

Figure 5:
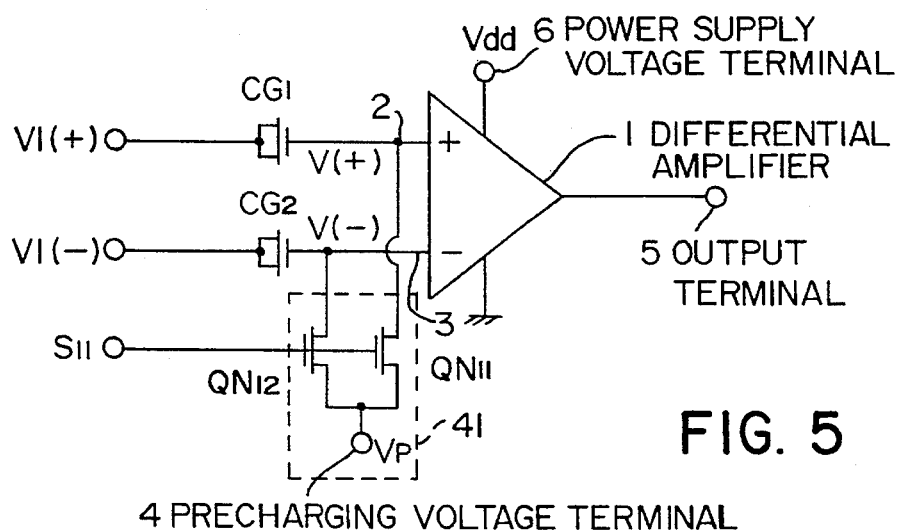
FIG. 5 is a circuit diagram for the chopper type differential amplifier showing a first embodiment of this invention.
Figure 6:
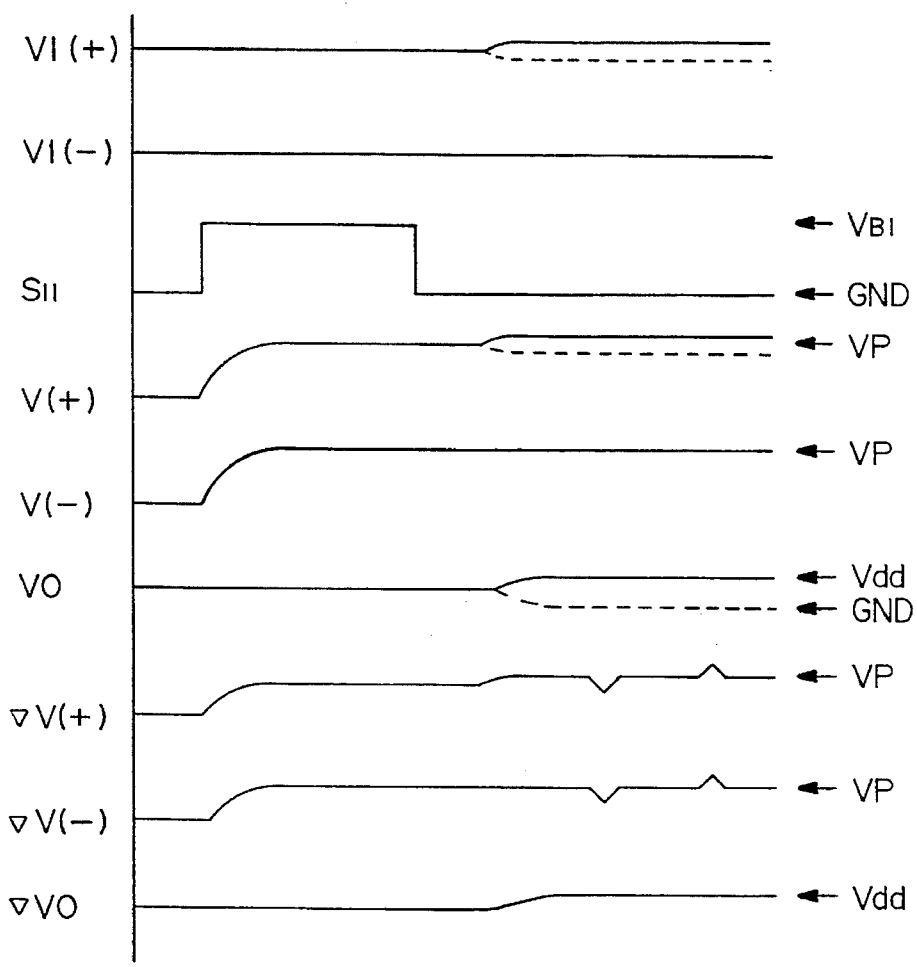
FIG. 6 is an operating waveform diagram of the chopper type differential amplifier shown in FIG. 5.

Furthermore, an effect similar to the above can be obtained when an equalizing N-channel MOS-FET is added to the first embodiment shown in FIG. 5.

According to this invention, the capacitances of the MOS gate capacitors for input can be kept constant without causing an unbalance regardless of the potentials of the input signals. Consequently, the correct output signal can always be output even if an in-phase noise is applied to the two input ends of the differential amplifier, so that it is possible to provide a chopper type differential amplifier having an excellent noise resistance and being free from malfunctions.

Furthermore, it is possible to cancel the offset voltage generated between the two input ends during the sampling period and further enhance the noise resistance by constituting the amplifier such that an equalizing N-channel MOS-FET is provided between the two input ends of the differential amplifier, and energizing the transistor during the sampling period.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. An amplifier comprising a differential amplifier having a first input end and a second input end, a first input terminal supplied with a first input signal, a second input terminal supplied with a second input signal, a first MOS gate capacitor having a gate electrode connected to said first input end of said differential amplifier and a lower electrode connected to said first input terminal, a second MOS gate capacitor having a gate electrode connected to said second input end of said differential amplifier and a lower electrode connected to said second input terminal, and a precharging circuit supplying a precharging voltage to the gate electrodes of said first and second MOS gate capacitors during a precharging period, said precharging voltage being larger in absolute value than a voltage of each of voltages of said first input signal and said second input signal.

2. The amplifier as claimed in claim 1, wherein said precharging circuit includes a precharging voltage terminal with said precharging voltage supplied thereto, a first N-channel MOS-FET having its gate electrode supplied with a sampling signal and its source-drain path connected between said first input end of said differential amplifier and said precharging voltage terminal, and a second N-channel MOS-FET having its gate electrode supplied with said sampling signal and its source-drain path connected between said second input end of said differential amplifier and said precharging voltage terminal.

3. The amplifier as claimed in claim 1, further comprising equalizing means provided between said first input end and said second input end of said differential amplifier, the operation thereof being controlled by a control signal.

4. A chopper type differential amplifier comprising a differential amplifier having a first input end and a second input end, a first input terminal supplied with a first input signal, a second input terminal supplied with a second input signal, a first MOS gate capacitor having its gate electrode connected to said first input end of said differential amplifier and its lower electrode connected to said first input terminal, a second MOS gate capacitor having its gate electrode connected to said second input end of said differential amplifier and its lower electrode connected to said second input terminal, a power supply voltage terminal supplied with a power supply voltage, voltage boost-up means connected to said power supply voltage terminal for boosting up said power supply voltage in response to a precharging signal, and means for supplying a boosted voltage to the gate electrode of said first MOS gate capacitor and the gate electrode of said second MOS gate capacitor as a precharging voltage during a precharging period, wherein said power supply voltage is substantially equal to the maximum level voltages of said first input signal and said second input signal.

5. The chopper type differential amplifier as claimed in claim 4, wherein said voltage boost-up means includes switching means provided between said power supply voltage terminal and a node and a capacitor having one of its electrodes supplied with said precharging signal and the other electrode connected to said node.

6. The chopper type differential amplifier as claimed in claim 4, further comprising equalizing means provided between said first input end and said second input end of said differential amplifier, the operation thereof being controlled by a control signal.

7. An amplifier comprising a differential amplifier having a first input end and a second input end, a first input terminal supplied with a first input signal, a second input terminal supplied with a second input signal, a first MOS gate capacitor having a gate electrode connected to said first input end of said differential amplifier and a lower electrode connected to said first input terminal, a second MOS gate capacitor having a gate electrode connected to said second input end of said differential amplifier and a lower electrode connected to said second input terminal, and a precharging circuit supplying a precharging voltage to the gate electrodes of said first and second MOS gate capacitors during a precharging period, said precharging circuit including a power supply voltage terminal supplied with a power supply voltage, voltage boost-up means connected to said power supply voltage terminal for boosting up said power supply voltage in response to a precharging signal, and means for supplying a boosted voltage as said precharging voltage to the gate electrode of said first MOS gate capacitor and the gate electrode of said second MOS gate capacitor, said precharging voltage being larger in absolute value than a voltage of each of voltages of said first input signal and said second input signal.

8. An amplifier comprising a differential amplifier having a first input end and a second input end, a first input terminal supplied with a first input signal, a second input terminal supplied with a second input signal, a first MOS gate capacitor having a gate electrode connected to said first input end of said differential amplifier and a lower electrode connected to said first input terminal, a second MOS gate capacitor having a gate electrode connected to said second input end of said differential amplifier and a lower electrode connected to said second input terminal, and a precharging circuit supplying a precharging voltage to the gate electrodes of said first and second MOS gate capacitors during a precharging period, said precharging circuit including a power supply voltage terminal supplied with a power supply voltage, switching means provided between said power supply voltage terminal and a node, a capacitor with one of its electrodes receiving a precharging signal and the other electrode being connected to said node, a first diode provided between said node and said first input end of said differential amplifier, and a second diode provided between said node and said second input end of said differential amplifier, said precharging voltage being larger in absolute value than a voltage of each of voltages of said first input signal and said second input signal.

* * * * *